United States Patent
Roggero et al.

(10) Patent No.: US 8,315,287 B1
(45) Date of Patent: Nov. 20, 2012

(54) SURFACE-EMITTING SEMICONDUCTOR LASER DEVICE IN WHICH AN EDGE-EMITTING LASER IS INTEGRATED WITH A DIFFRACTIVE LENS, AND A METHOD FOR MAKING THE DEVICE

(75) Inventors: Guido Alberto Roggero, Turin (IT); Rui Yu Fang, Turin (IT); Luigi Tallone, Paesana (IT)

(73) Assignee: Avago Technologies Fiber IP (Singapore) Pte. Ltd, Singapore (SG)

( * ) Notice: Subject to any disclaimer, the term of this patent is extended or adjusted under 35 U.S.C. 154(b) by 0 days.

(21) Appl. No.: 13/099,429

(22) Filed: May 3, 2011

(51) Int. Cl.
  *H01S 5/00* (2006.01)
(52) U.S. Cl. ............... 372/50.11; 372/50.1; 372/50.124
(58) Field of Classification Search .............. 372/50.1, 372/50.11, 50.124
  See application file for complete search history.

(56) References Cited

U.S. PATENT DOCUMENTS

| | | | |
|---|---|---|---|
| 4,733,094 A | 3/1988 | Carpentier et al. |
| 4,821,997 A | 4/1989 | Zdeblick |
| 4,990,465 A | 2/1991 | Liau et al. |
| 5,100,220 A | 3/1992 | Voegeli |
| 5,159,603 A | 10/1992 | Kim |
| 5,463,649 A | 10/1995 | Ashby et al. |
| 5,671,243 A | 9/1997 | Yap |
| 5,912,872 A | 6/1999 | Feldman et al. |
| 5,987,202 A | 11/1999 | Gruenwald et al. |
| 6,066,859 A | 5/2000 | Stegmueller |
| 6,101,204 A | 8/2000 | Johnston |
| 6,185,240 B1 | 2/2001 | Jiang et al. |
| 6,459,716 B1 | 10/2002 | Lo et al. |
| 6,722,792 B2 | 4/2004 | Raj et al. |
| 6,940,885 B1 | 9/2005 | Cheng et al. |
| 6,973,110 B2 | 12/2005 | Althaus et al. |
| 7,122,391 B2 | 10/2006 | Kuzma |
| 7,245,645 B2 | 7/2007 | Behfar et al. |
| 7,450,621 B1 | 11/2008 | Tallone et al. |
| 7,450,623 B2 * | 11/2008 | O'Daniel et al. ........... 372/50.11 |

(Continued)

FOREIGN PATENT DOCUMENTS

CN 1595741 3/2005
(Continued)

OTHER PUBLICATIONS

Hans, L. A. et al., "Microsystems and Wafer Processes for volume Production of Highly Reliable Fiber Optic Components for Telecom- and Datacom-Application", *IEEE Transactions on Components, Packaging and Mfg. Tech.—Part B*, vol. 21, No. 2, May 1998, 147-156.

(Continued)

*Primary Examiner* — Yuanda Zhang (57) ABSTRACT

A surface-emitting semiconductor laser device is provided that includes an edge-emitting laser integrated in a semiconductor material with various reflectors and a diffractive lens. The edge-emitting laser has a first section comprising an active MQW region, a second section comprising a passive region and a third section comprising a semi-insulating or un-doped semiconductor bulk layer. This configuration ensures that the injection current will pass through all of the layers of the active region, thereby preventing the occurrence of optical losses due to un-injected areas of the MQW active region. In addition, the inclusion of the passive region ensures that there is no current passing through the interface between the active MQW region and the regrown semiconductor bulk layer. The latter feature improves performance and device reliability.

11 Claims, 7 Drawing Sheets

U.S. PATENT DOCUMENTS

| | | |
|---|---|---|
| 7,502,403 B2 | 3/2009 | Shinoda et al. |
| 7,508,047 B2 | 3/2009 | Tatum et al. |
| 7,693,201 B2 | 4/2010 | Albrecht et al. |
| 7,738,522 B2 | 6/2010 | Henrichs |
| 7,750,356 B2 | 7/2010 | Wang |
| 7,924,899 B2 | 4/2011 | Kondo |
| 2002/0003824 A1 | 1/2002 | Lo et al. |
| 2002/0159491 A1 | 10/2002 | Jiang et al. |
| 2002/0163865 A1 | 11/2002 | Zimmer et al. |
| 2004/0066817 A1 | 4/2004 | Ungar |
| 2004/0101020 A1 | 5/2004 | Bhandarkar |
| 2004/0146236 A1 | 7/2004 | Fang et al. |
| 2005/0001282 A1 | 1/2005 | Steinberg |
| 2005/0062122 A1 | 3/2005 | Gallup et al. |
| 2005/0285131 A1 | 12/2005 | Gallup et al. |
| 2005/0285242 A1 | 12/2005 | Gallup |
| 2006/0239319 A1 | 10/2006 | Kozlovsky et al. |
| 2006/0291516 A1 | 12/2006 | Aoki |
| 2007/0047609 A1 | 3/2007 | Francis et al. |
| 2007/0188951 A1 | 8/2007 | Crews |
| 2007/0246716 A1 | 10/2007 | Bhat et al. |
| 2010/0034223 A1 | 2/2010 | Osinski et al. |
| 2010/0258949 A1 | 10/2010 | Henderson et al. |
| 2010/0290489 A1* | 11/2010 | Agresti et al. .......... 372/26 |
| 2011/0079893 A1 | 4/2011 | Sherrer et al. |
| 2012/0183007 A1 | 7/2012 | Roggero et al. |

FOREIGN PATENT DOCUMENTS

| | | |
|---|---|---|
| DE | 3914835 | 5/1989 |
| DE | 19510559 | 3/1995 |
| DE | 10305171 | 8/2004 |
| DE | 102005031132 | 7/2005 |
| EP | 0445488 | 9/1991 |
| EP | 1515364 | 3/2005 |
| GB | 2369725 | 6/2002 |
| GB | 2488399 | 8/2012 |
| JP | 62158377 | 7/1987 |
| JP | 2231786 A | 9/1990 |
| JP | 2000196173 | 7/2000 |
| WO | WO 02/089276 | 11/2002 |
| WO | WO-2004049521 | 6/2004 |

OTHER PUBLICATIONS

Park, J.; Lee, T.; Lee, D.; Kim, S.; Chung, Y., Hybrid-integrated tunable laser using polymer coupled-ring reflector, IEEE Xplore; Dec. 4, 2008, pp. 1464-1466, vol. 44 Issue 25, IEEE.

* cited by examiner

SURFACE-EMITTING SEMICONDUCTOR LASER DEVICE IN WHICH AN EDGE-EMITTING LASER IS INTEGRATED WITH A DIFFRACTIVE LENS, AND A METHOD FOR MAKING THE DEVICE

TECHNICAL FIELD OF THE INVENTION

The invention relates generally to semiconductor laser devices and, more particularly, to a surface-emitting semiconductor laser device in which an edge-emitting laser and a diffractive lens are integrated together on the same chip.

BACKGROUND OF THE INVENTION

Semiconductor lasers are commonly used in optical transceivers for telecommunications and data communication networks. The lasers used in such optical transceivers are commonly of the edge-emitting type. The edge-emitting laser of an optical transceiver is commonly coupled to the fiber with an aspheric lens or other discrete optical element because the light that the laser emits is not focalized or collimated, i.e., it diverges in a cone shape as it propagates. While the use of lenses to couple edge-emitting lasers to fibers in optical transceivers works reasonably well, it would be desirable to improve transceiver manufacturing economy by minimizing the number of transceiver parts and the attendant steps needed to achieve optical alignment among them.

Edge-emitting lasers for optical transceivers are fabricated on semiconductor wafers using standard photolithographic and epitaxial methods, diced into chips, and portions of each chip coated with highly-reflective and anti-reflective coatings. The finished chips can then be tested. It would be desirable to minimize the number of manufacturing steps as well as to enhance testability.

It has also been proposed to integrate a diffractive lens and an edge-emitting laser on the same chip. For example, U.S. Pat. No. 6,459,716 to Lo et al. discloses a device in which an edge-emitted beam produced by an edge-emitting laser is reflected by an angled surface toward a lower reflective surface that is parallel to the beam-emission direction and parallel to the chip surface, which, in turn, reflects the beam upwardly in a direction generally perpendicular to the chip surface. The upwardly reflected beam is then emitted through an aspheric lens formed in a material on the chip surface to collimate laser beam divergence. A transceiver having such a device can be manufactured more economically than one in which a separate lens is included. Nevertheless, the device is not straightforward to fabricate due to the inclusion of a waveguide to direct the beam from the laser toward the angled surface. Also, the geometry of the device may make its optical characteristics sensitive to wafer thickness errors.

Vertical Cavity Surface Emitting Lasers (VCSELs) are often preferred by end-users because of their high coupling efficiency with optical fibers without the need to provide beam shape correction, thus reducing test/packaging costs. VCSELs, however, still have problems with regard to single-mode yield control when manufactured for very high speed operation.

Efforts have also been made in the industry to convert an edge-emitting device into a vertical-emitting device. For example, U.S. Pat. No. 7,245,645 B2 discloses one or both of the laser facets etched at 45° angles to form a 45° mirror that reflects the laser beam vertically. In this solution, however, the 45° mirror is within the laser cavity. U.S. Pat. No. 5,671,243 discloses using conventional 90° laser facets, but outside of the lasing cavity there is a 45° reflection mirror that turns the beam towards in the direction of the surface. Nevertheless, the inclusion of an etched mirror inside or outside of the laser cavity requires high quality facet etching to be performed during fabrication. Performing high quality etching presents significant reliability issues, especially when performing dry etching under high operating power due to facet damage that can occur during the dry etching process.

U.S. Pat. No. 7,450,621 to the assignee of the present application discloses a solution that overcomes many of the aforementioned difficulties. This patent discloses a semiconductor device in which a diffractive lens is integrated with an edge-emitting laser on the same chip. The diffractive lens is monolithically integrated with the edge-emitting laser on an indium phosphide (InP) substrate material. The monolithic integration of a diffractive lens on the same chip in which the edge-emitting laser is integrated requires the performance of multiple Electron Beam Lithography (EBL) exposure and dry etching processes. It would therefore seem that the device fabrication costs would increase. However, with respect to using a separate lens to correct the beam divergence before the light enters the optical fiber, the overall cost of a monolithic integration of a laser with a diffractive lens is still less than the cost of packaging separate components.

In FIG. 1 of U.S. Pat. No. 7,450,621, the layer 20 (typically InP) in which the lens 18 is to be formed is grown on multiple quantum well (MQW) layers that have been etched to form the laser 10. Although the materials that are used for the MQW layers that form the laser 10 are not explicitly recited in the patent, for 1300-1550 nanometer (nm) range wavelength application, the MQW layers typically comprise Indium Gallium Aluminum Arsenide (InGaAlAs) due to their excellent temperature characteristics. Assuming InP is used for layer 20, before growth of the InP layer 20, the Al-containing MQW layers that make up the laser 10 have to be etched away. However, the Al-containing material is easily oxidized when exposed to humidity and oxygen ($O_2$). The oxidized Al-containing material may not be completely removed during the etching process. At operating lasing conditions, any remaining oxidized Al-containing material can cause a portion of the injection current to leak through the interface between the InP and the InGaAlAs MQW, which can detrimentally affect device performance and reliability.

Another potential problem is the difficulty associated with using a wet chemical etching process to realize a reverse-mesa ridge structure having a low series resistance. Usually, such a reverse-mesa ridge structure is realized by selectively etching the InP layer down to an InGaAsP etch-stop layer. It can be difficult from a process standpoint to realize a reverse-mesa ridge structure that ends precisely at this interface using photolithographic and wet chemical etching techniques. In particular, if the reverse-mesa ridge structure extends over the interface, the wet chemical etching of the InP layer can destroy the MQW layers because under the InP layer there is no etch-stop layer. On the other hand, if the reverse-mesa ridge structure does not reach the interface, this can prevent the injection current from passing through all of the MQW layers, which can result in very large optical losses due to un-injected MQW layers. These difficulties can reduce manufacturing yield and increase costs.

It would be desirable to provide a semiconductor device in which an edge-emitting laser is integrated with a diffractive lens. It would also be desirable to provide such a semiconductor device that is reliable, economical to manufacture and that can be manufactured with high yield.

SUMMARY OF THE INVENTION

The invention is directed to a surface-emitting semiconductor laser device and a method for fabricating the device.

The device comprises a substrate having an upper surface and a lower surface, a plurality of semiconductor layers disposed on the substrate, an edge-emitting laser formed in the semiconductor layers for producing laser light of a lasing wavelength, an angled side reflector disposed on an angled side facet formed in one or more of said plurality of semiconductor layers, a lower reflector disposed on or near the lower surface of the semiconductor substrate, and a diffractive lens disposed in at least the uppermost layer of one or more of the semiconductor layers. The edge-emitting laser has an active MQW region having a first end and a second end and a passive MQW region having a first end and a second end. The second end of the active MQW region is joined to the first end of the passive MQW region. The laser has a rear facet corresponding to the first end of the active MQW region and a front facet corresponding to the second end of the passive MQW region. If the laser is activated, laser light produced in the active MQW region propagates along an optical axis of the laser that is substantially parallel to the upper and lower surfaces of the substrate through the active MQW region, out of the second end of the active MQW region, into the first end of the passive MQW region, through the passive MQW region, and out of the front facet of the laser. A first portion of the laser light propagating out of the front facet impinges directly upon the upper reflector and is reflected thereby onto the angled side reflector. A second portion of the laser light propagating out of the front facet impinges directly upon the angled side reflector. The angled side reflector reflects the impinging first and second portions of laser light onto the lower reflector. The lower reflector reflects the first and second portions of laser light through the diffractive lens, which directs the laser light in a direction that is substantially normal to the upper surface of the substrate.

The fabrication method comprises depositing or growing a plurality of semiconductor layers on a semiconductor substrate, forming an edge-emitting laser for producing laser light of a lasing wavelength to have an active MQW region and a passive MQW region, forming an upper reflector on or near an uppermost layer of the plurality of semiconductor layers above the front facet of the laser, forming an angled side reflector on an angled side facet formed in one or more of the plurality of semiconductor layers, forming a lower reflector on or near the lower surface of the semiconductor substrate, and forming a diffractive lens in at least the uppermost layer of the semiconductor layers.

These and other features and advantages of the invention will become apparent from the following description, drawings and claims.

DETAILED DESCRIPTION OF AN ILLUSTRATIVE EMBODIMENT

The invention is directed to a surface-emitting semiconductor laser device in which an edge-emitting laser and a diffractive lens are integrated together in the semiconductor laser device. The edge-emitting laser has a first section comprising an active MQW region and a second section comprising a passive MQW region that is transparent to the emission wavelength of the laser. A third section of the surface-emitting semiconductor laser device comprises a semiconductor bulk material. This configuration ensures that the injection current will pass through all of the layers of the active region, thereby preventing optical loss from occurring due to un-injected regions. The configuration also ensures that there is no current passing through the interface between the active MQW region and the bulk semiconductor layer. The latter feature improves performance and device reliability. However, the ridge structure of the laser should extend about 2 to 3 micrometers (microns) over the interface between active and passive MQW regions in order to avoid current loss in passive MQW region, as will be described below in detail with reference to the figures.

As will be described below in more detail, the inclusion of the passive MQW region in the semiconductor device in combination with other features discussed below prevents injection current from passing through a potentially defective interface while also ensuring that the injection current passes through all of the layers of active MQW region. These features ensure that the semiconductor laser device has good reliability and performance characteristics while also easing manufacturing tolerances and providing improved manufacturing yield. Exemplary, or illustrative, embodiments of the semiconductor laser device and of the manner in which it may be manufactured will now be described with reference to FIGS. 1-10, which are not drawn to scale.

Figure 1:
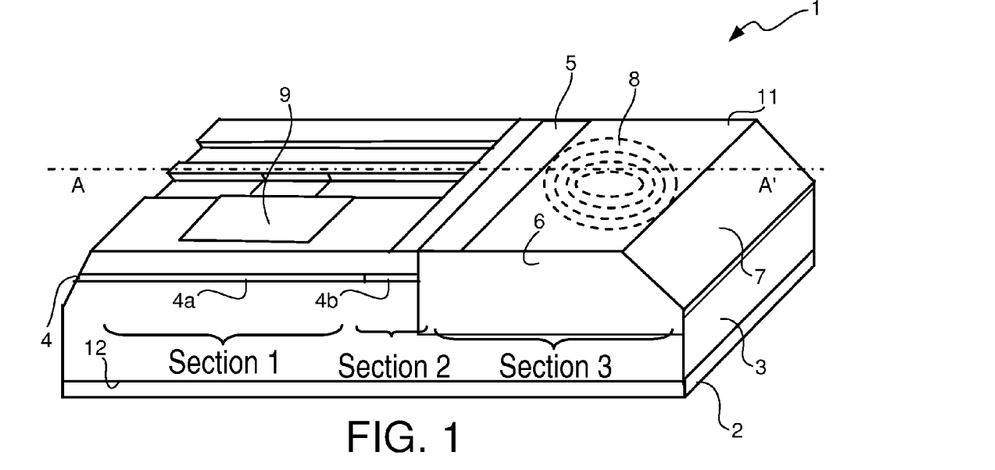
FIG. 1 illustrates a top perspective view of a semiconductor laser device in accordance with an exemplary embodiment of the invention.
Figure 2:
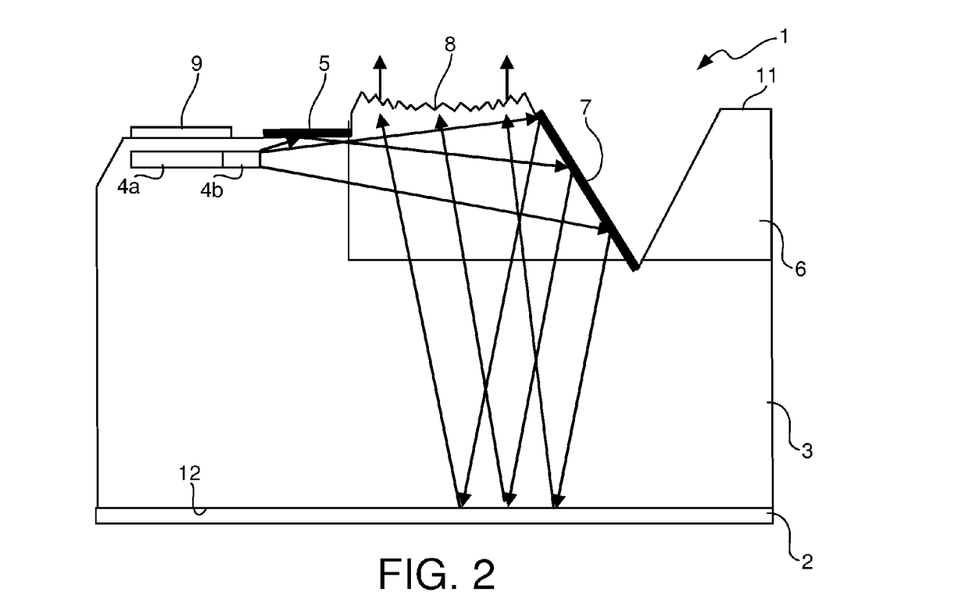
FIG. 2 is a cross-sectional side view of the semiconductor laser device shown in FIG. 1 the taken along line A-A' of FIG. 1.

FIG. 1 illustrates a perspective view of a semiconductor laser device 1 in accordance with an exemplary embodiment of the invention. FIG. 2 illustrates a cross-sectional side view of the semiconductor laser device 1 shown in FIG. 1 taken along line A-A' of FIG. 1. As shown in FIG. 1, in an illustrative or exemplary embodiment of the invention, the semiconductor laser device 1 includes an n-type metal contact layer 2, a semiconductor substrate 3, an edge-emitting laser 4, an upper reflector 5, an un-doped or semi-insulating bulk semiconductor material layer 6, an angled side reflector 7, a diffractive lens 8, and a p-type metal contact 9. The material of which the semiconductor substrate 3 is made may be, for example, doped indium phosphide (InP) or gallium arsenide (GaAs). For exemplary purposes, it will be assumed that the semiconductor substrate 3 is made of doped InP. It will also be assumed for exemplary purposes that the bulk semiconductor material layer 6 comprises un-doped or semi-insulating InP, although other semiconductor materials may be used as the layer 6. The semiconductor laser device 1 typically includes additional layers of materials, as will be described below in further detail with reference to FIGS. 3A-10.

The edge-emitting laser 4 is typically a ridge structure, such as a reverse-mesa ridge structure, as is known in the art. Methods that may be used to form such a ridge structure are discussed in detail in U.S. Pat. No. 7,539,228, which is assigned to the assignee of the present application and which is hereby incorporated by reference herein in its entirety. As disclosed in that patent, the ridge structure may be etched using convention techniques described in the background of that patent, or grown using techniques described in the detailed description that patent.

The upper and angled side reflectors 5 and 7, respectively, typically comprise highly-reflective (HR) coatings. The diffractive lens 8 may be formed using any suitable technique, such as by using electron beam lithography and reactive ion etching to transfer a suitable computer-generated holographic pattern into an upper surface 11 of the semiconductor laser device 1. A process known as imprinting may also be used for this purpose. The process of forming the diffractive lens 8 is described below in more detail with reference to FIG. 9. The substrate 3 has a lower surface 12 that is generally parallel to the upper surface 11 of the semiconductor laser device 1.

During operations, the edge-emitting laser 4 emits a light beam generally along an axis that is parallel to the planes defined by the upper and lower surfaces 11 and 12, respectively. The laser 4 has a first section, section 1, comprising an active MQW region 4a and a second section, section 2, comprising a passive MQW region 4b of the laser 4. The laser beam passing out of the active MQW region 4a has a spot-size that typically ranges from about 1 to 2 microns for a single transverse mode laser design. The laser beam emitted out of the active MQW region 4a propagates through the passive MQW region 4b, which is transparent to the operational, or lasing, wavelength of the laser 4. As the laser beam passes out of the passive MQW region 4b, it diverges to some extent due to the fact that, in the passive region 4b, the beam is confined in transverse direction, but not in lateral direction. As will be described below with reference to FIG. 5, the passive region 4b may be a bulk quaternary layer grown by a known butt-joint fabrication technique rather than an MQW layer. However, the phrase "passive MQW region", as that phrase is used herein, is intended to include both MQW layers and bulk quaternary layers that provide a passive region having a lower photoluminescence peak than that of the active MQW region 4a.

The beam passing out of the passive MQW region 4b enters section 3, which is an un-doped or semi-insulating semiconductor material layer 6. Making the layer 6 of un-doped or semi-insulating semiconductor material prevents optical absorption from occurring in this layer. In accordance with this example, the layer 6 comprises InP. The laser beam further diverges as it propagates in section 3 where there is no optical confinement. As diverging laser light propagating out of the passive MQW region 4b impinges on the upper reflector 5, it is reflected by the upper reflector 5 onto the side reflector 7. The angled side reflector 7 directs the laser light impinging thereon onto the n-type metal contact 2. The n-type metal contact 2 is highly reflective and therefore reflects the laser light impinging thereon toward the diffractive lens 8. As indicated above, the diffractive lens 8 collimates the laser light and directs it out of the device 1 in a direction that is generally normal to the upper surface 11 of the semiconductor laser device 1. For this reason, the semiconductor laser device 1 is referred to herein as being "surface-emitting." The beam outside of the diffractive lens 8 will have a shape and a phase that are optimal for coupling with an optical fiber (not shown).

The semiconductor laser device 1 shown in FIGS. 1 and 2 may be manufactured using conventional techniques. Illustrative or exemplary steps for manufacturing such a device are illustrated in FIG. 3A-10. It should be noted, however, that the order of the steps shown in FIGS. 3A-10 is intended only for purposes of illustration. The steps may be performed in any other suitable order, as will be understood by those skilled in the art in view of the description being provided herein. Furthermore, additional steps of the type commonly used in fabricating such devices may also be included, as persons skilled in the art will understand.

Figure 3A:
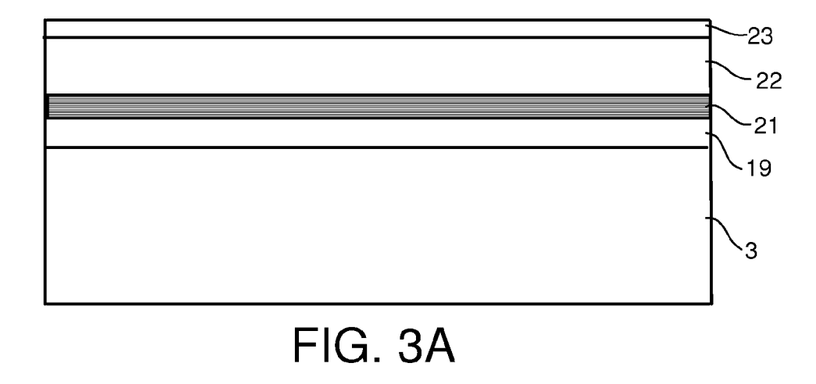
FIGS. 3A-3C show side cross-sectional views of the device shown in FIG. 1 during the fabrication process and together illustrate a sequence of process steps in accordance with an illustrative embodiment that may be used to fabricate an edge-emitting laser of the semiconductor laser device shown in FIG. 1 to have an active MQW region and a passive MQW region by the use of an intermixing technique.
Figure 3B:
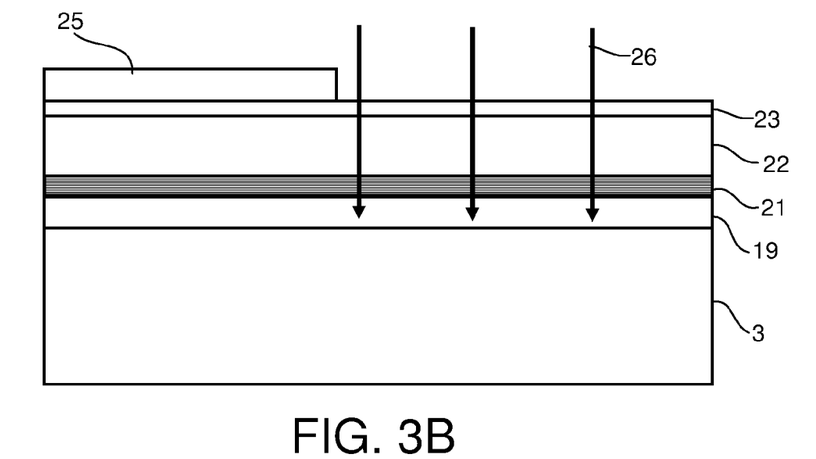
Figure 3C:
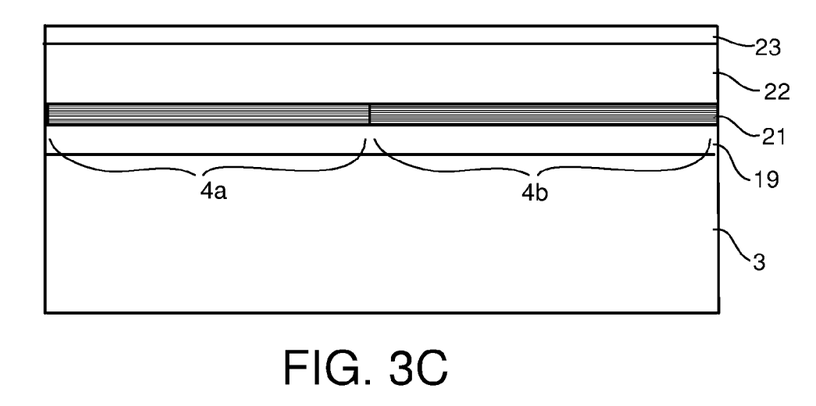

The active and passive MQW regions 4a and 4b can be formed using various known processes. One known process that may be used for this purpose is called "intermixing". Another known process that may be used for this purpose is called "Selective Area Growth," or "SAG". FIGS. 3A-3C are side cross-sectional views that illustrate the formation of the active and passive MQW regions 4a and 4b, respectively, through the use of intermixing. Firstly, MQW layers 21 and cladding and contact layers 22 and 23, respectively, are grown through Metal-Organic Chemical Vapor Deposition (MOCVD) on a buffer layer 19 that is disposed on the planar InP substrate 3 (FIGS. 1 and 2), as shown in FIG. 3A. The MQW layers 21 are designed to have the desired emitting wavelength of the laser 4 (FIGS. 1 and 2).

Then, a mask 25 is placed on top of the contact layer 23 to protect what is to be the active MQW region 4a (FIGS. 1 and 2) of the MQW layers 21 from an Argon (Ar) ion implantation process that is to follow. Then, the Ar ion implantation process is performed during which Ar ions, which are represented by arrows 26, pass through the unmasked regions and enter the MQW layers 21 to create defects within the MQW layers 21, as shown in FIG. 3B. A rapid thermal annealing (RTA) process (not shown) is then performed to cause the atoms in the well and barrier layers of the MQW layers 21 to "intermix" within the implanted area. This annealing process causes the passive MQW region 4b to have a lower photoluminescence peak than that of the active MQW region 4a. In addition, the annealing process also removes the defects that were created in the MQW layers 21 by the ion implantation process. The mask 25 is then removed, as shown in FIG. 3C.

Figure 4A:
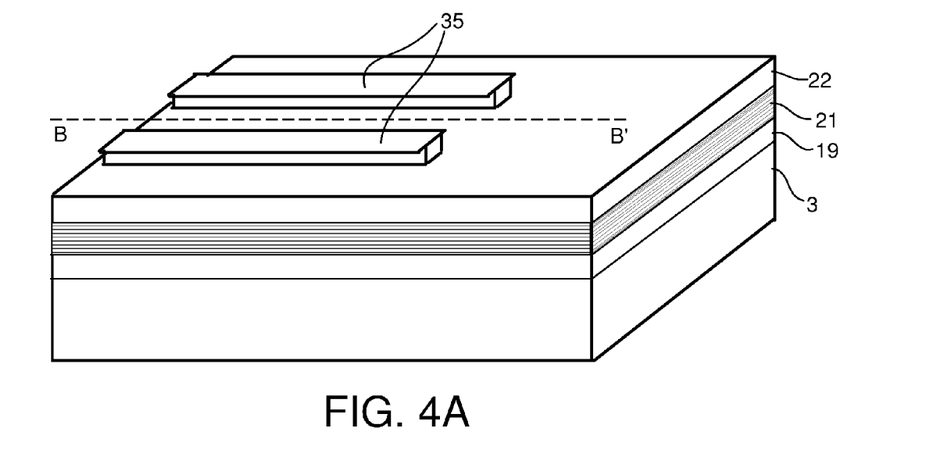
FIGS. 4A and 4B show top perspective and side cross-sectional views, respectively, of a portion of the device shown in FIG. 1 during the fabrication process and together illustrate a sequence of process steps in accordance with another illustrative embodiment that may be used to fabricate an edge-emitting laser of the semiconductor laser device shown in FIG. 1 to have an active MQW region and a passive MQW region by a technique known as Selective Area Growth (SAG).
Figure 4B:
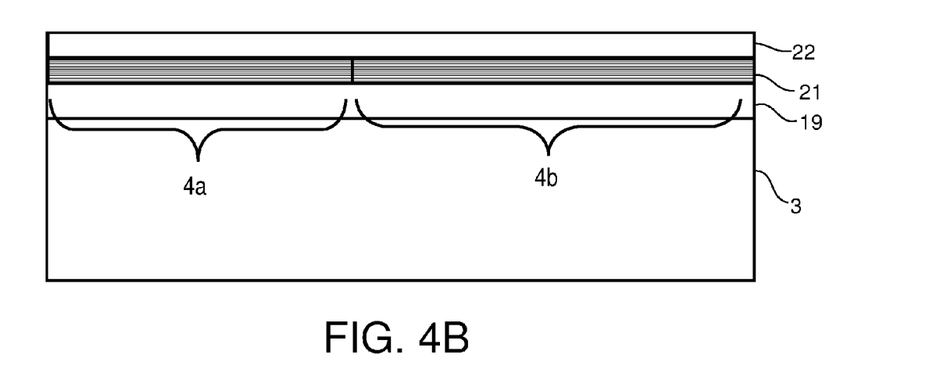

FIG. 4A shows a top perspective view of a portion of the device 1 shown in FIG. 1 during fabrication. FIG. 4B shows a side cross-sectional view of the portion of the device shown in FIG. 4A taken along line B-B'. In accordance with the embodiment illustrated in FIGS. 4A and 4B, a SAG process is used to form the active and passive MQW regions 4a and 4b, respectively. As shown in FIG. 4A, before growth, a patterned dielectric mask 35 is fabricated on the cladding layer 22. The unmasked regions are then etched (not shown) down to the substrate 3. The etching is controlled by inserting an etch-stop layer (not shown), which is typically a thin InGaAsP layer. The buffer layer 19 and the MQW layers 21 are then grown on the patterned surface of the substrate 3 using MOCVD. Due to the presence of the patterns, In and Ga atoms are more abundant in the patterned areas than in the open areas, resulting in the MQW layers 21 having a higher photoluminescence peak in the patterned area than in the open area. The portion of the MQW layers 21 that have the higher photoluminescence peak make up the active MQW region 4a (FIGS. 1 and 2) and the portion of the MQW layers 21 that have the lower photoluminescence peak make up the passive MQW region 4b.

The difference between the photoluminescence peaks of the patterned and open areas depends on various process parameters, such as mask distance, mask width and mask shape. Persons skilled in the art will understand, in view of the description provided herein, the manner in which these and/or other process parameters may be adjusted to achieve the desired photoluminescence peaks. Usually, the buffer 19, the MQW layers 21, the cladding layer 22, and the contact layer 23 are grown using the SAG process. However, in the case of a distributed feedback (DFB) laser, only the buffer 19 and the MQW layers 21 are grown using the SAG process. In the latter case, in order to obtain the device shown in FIG. 3C, an additional MOCVD growth process is used to form the cladding and contact layers 22 and 23.

Figure 5:
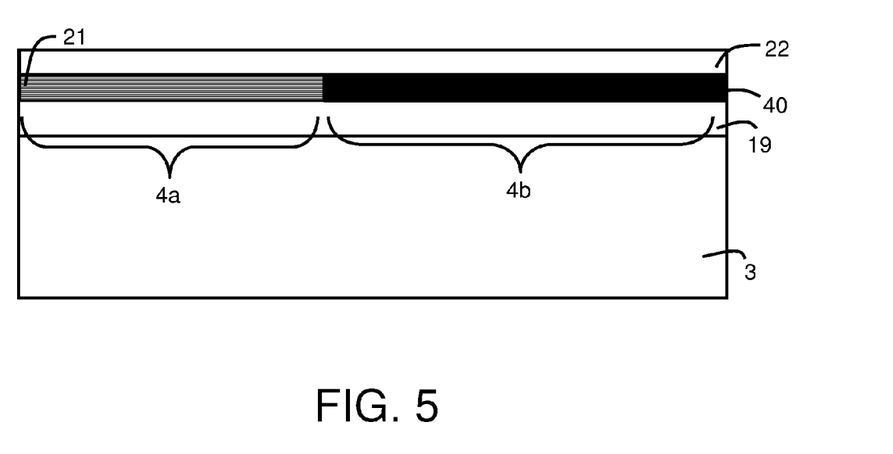
FIG. 5 shows a side cross-sectional view of a portion of the device shown in FIG. 1 in accordance with an embodiment in which a butt-joint growth technique is used to grow a bulk quaternary layer in the passive region that has a lower photoluminescence peak than the active MQW region

FIG. 5 illustrates a side cross-sectional view of a portion of the device 1 shown in FIG. 1 taken along line A-A' during a butt-joint fabrication process in which the passive region 4b is fabricated as a bulk quaternary layer 40 rather than as MQW layers. When either the intermixing technique (FIGS. 3A-3C) or the SAG technique (FIGS. 4A and 4B) is used, two different compositions of MQW layers are grown without an interface in such a way that region 4a comprises active MQW stacks designed to emit a primary wavelength and region 4b comprises passive MQW layers that have a wider energy gap and are transparent to the emitting wavelength. In accordance with the embodiment shown in FIG. 5, section 4b is a bulk quaternary layer 40 that is grown using a known butt-joint processing technique. The bulk quaternary layer 40 of region 4b has a lower photoluminescence peak than the MQW layers 21 of active region 4a. One disadvantage of using this technique is that it can be difficult to ensure that there is a defect-free interface between the AL-containing MQW layers 21 and the bulk quaternary layer 40. If this cannot be ensured, there may be reliability issues due to injection current passing through this interface. U.S. Pat. No. 7,018,861, which is assigned to the assignee of the present application and which is hereby incorporated by reference herein in its entirety, discloses a detailed solution for the butt-joint growth of a quaternary layer. Therefore, a detailed discussion of this technique will not be provided herein in the interest of brevity.

Figure 6A:
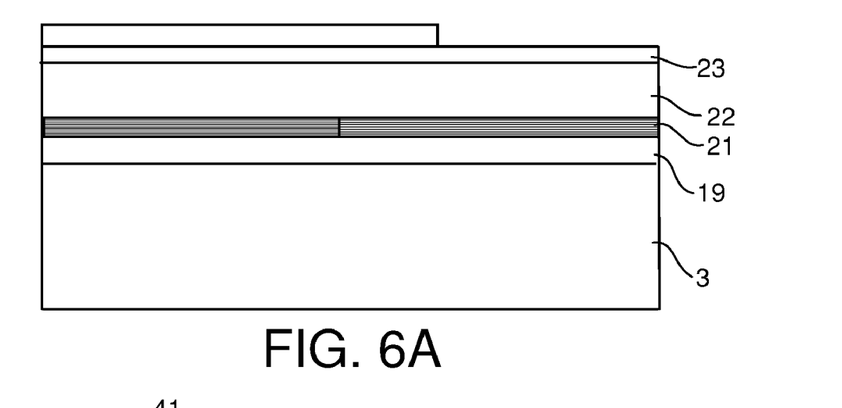
FIGS. 6A-6C show side cross-sectional views of the device shown in FIG. 1 during the fabrication process and together illustrate a sequence of process steps in accordance with an illustrative embodiment that are performed to grow a bulk semiconductor layer after performing either the process of FIGS. 3A-3C or the process of FIGS. 4A-4B.
Figure 6B:
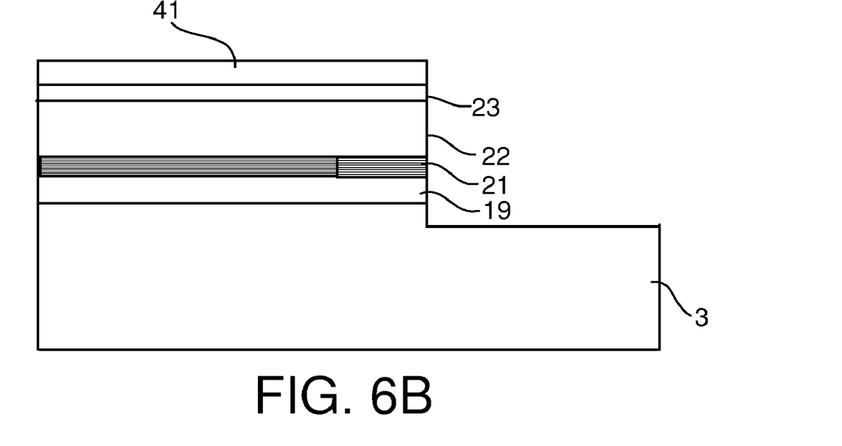
Figure 6C:
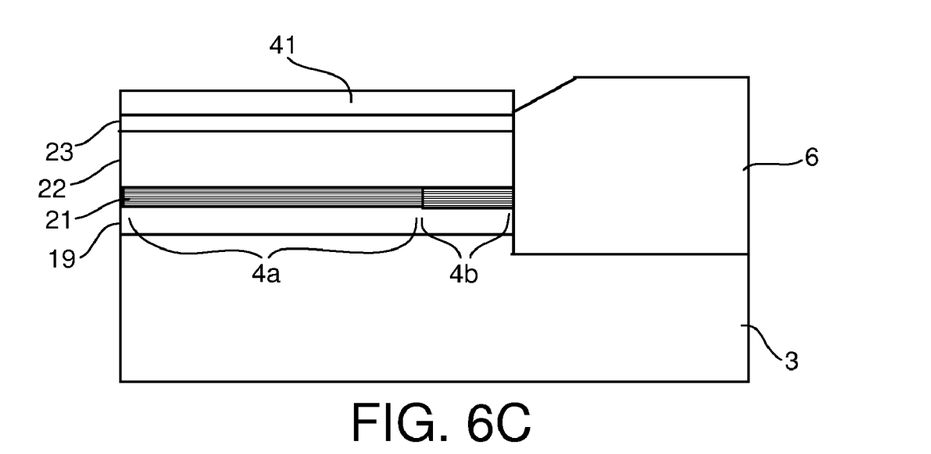

After the active and passive MQW regions 4a and 4b (FIGS. 1 and 2) have been formed, section 3 (layer 6 in FIG. 1) is formed by using a SAG process to grow the InP layer 6, as will now be described with reference to FIGS. 6A-6C. FIGS. 6A-6C show cross-sectional side views that represent the process of forming the layer 6. With reference to FIG. 6A, a dielectric mask pattern 41 is formed by conventional plasma-enhanced CVD (PECVD), photolithography and etching steps. The portions of the layers that are outside of dielectric mask pattern 41 are etched off by wet chemical etching, as shown in FIG. 6B. The un-doped or semi-insulating InP layer 6 is then formed through use of a SAG process, as shown in FIG. 6C.

Figure 7:
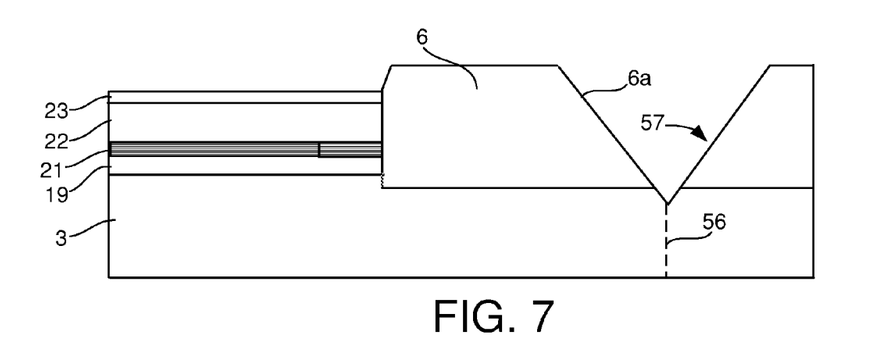
FIG. 7 shows a side cross-sectional view of the device shown in FIG. 6C and illustrates a process of forming a V-shaped groove in the bulk semiconductor layer shown in FIG. 6C in order to form an angled side facet that will serve to hold a side reflector of the semiconductor laser device shown in FIG. 1.

After the InP layer 6 has been formed, an angled side facet is formed in layer 6 by using a wet chemical etching process. FIG. 7 shows a side cross-sectional view that represents the formation of a generally V-shaped groove 55 in layer 6 to create the angled side facet 6a. The angle of the angled side facet 6a depends on chemical etching solution that is selected for use in the etching process. Layer 6 is transparent to the operational, or lasing, wavelength of the laser 4 (FIGS. 1 and 2). At a point later in the process, the device shown in FIG. 7 will be separated along either an area represented by dashed line 56 or sawed through portion 57.

After the angled side reflector 7 has been formed, the aforementioned ridge structure of the laser 4 is formed, as will now be described with reference to FIGS. 8-10.

Figure 8:
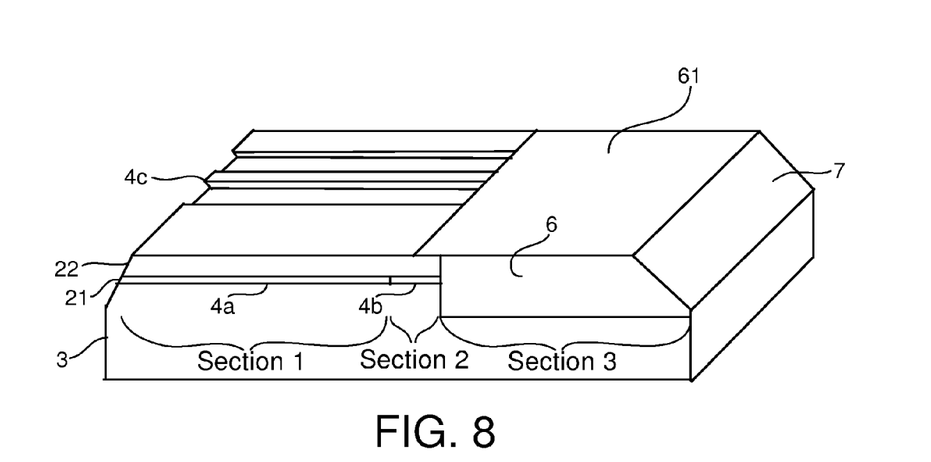
FIG. 8 shows a top perspective view of the device shown in FIG. 7 that represents the process of forming a reverse-mesa ridge structure of the edge-emitting laser of the semiconductor laser device shown in FIG. 1.

FIG. 8 is a top perspective view that illustrates formation of a ridge structure. As shown in FIG. 8, a dielectric ridge mask pattern 61 is deposited and defined to form a ridge structure. The area reserved for the diffractive lens 8 is covered by the ridge mask pattern 61. A small portion (e.g., a few microns) of the ridge mask pattern 61 extends partially over the passive MQW region 4b. The ridge 4c is etched by using a selective wet chemical etching process to form a reverse-mesa shape designed to achieve a relatively low laser series resistance, as shown in FIG. 8. An InGaAsP quaternary layer (not shown) is typically included above the MQW layers 21 to act as an etch stop. Extending the ridge mask pattern 61 partially over section 2 (the passive MQW region 4b) guarantees that the ridge structure 4c will extend through the entire active MQW region 4a, which, in turn, ensures that the injection current will pass through all of section 1 (the active MQW region 4a). This feature helps ensure that there will not be optical losses due to un-injected areas in the active MQW layers 21. At the same time, because the active MQW region 4a is spaced apart from section 3 by the passive MQW region 4b, the current will not pass the interface between the active MQW region 4a and the regrown bulk layer 6, which obviates the possibility that defects in the regrowth interface could degrade performance. This latter feature improves the reliability of the semiconductor laser device 1.

In addition, extending the ridge structure 4c partially into the passive MQW region 4b in the manner described above also makes the device 1 easier to manufacture than would otherwise be the case. As indicated above with respect to U.S. Pat. No. 7,450,621, a reverse-mesa ridge structure is typically realized by selectively etching the InP layer down to an InGaAsP etch-stop layer. It can be difficult from a process standpoint to realize a reverse-mesa ridge structure that ends precisely at the interface between the active MQW region and the bulk semiconductor material using photolithographic and wet chemical etching techniques. Because, in accordance with the invention, this interface is eliminated and the ridge structure 4c is extended into the passive MQW region 4b, the end of the ridge structure 4c does not have to be precisely aligned with the end of the active MQW region 4a, which allows the device 1 to be manufactured more easily with higher yield.

Figure 9:
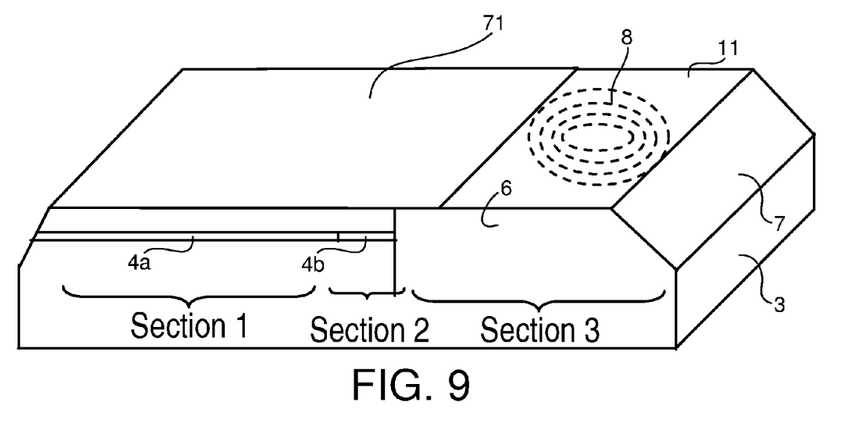
FIG. 9 shows a top perspective view of the device shown in FIG. 8 after a mask has been deposited over a portion of the device and represents a process of forming the diffractive lens shown in FIGS. 1 and 2 on the upper surface of the bulk semiconductor layer shown in FIG. 8.

FIG. 9 is a top perspective view that illustrates the formation of the diffractive lens 8 in section 3 (i.e., on the upper surface of layer 6). The laser structure in section 1 is covered with a photoresist or dielectric mask 71. After the mask 71 has been deposited, the diffractive lens 8 is fabricated on the upper surface of layer 6, typically by using multiple Electron Beam Lithography and dry etching processes. It should be noted, however, that "imprinting" techniques may also be used to create the diffractive lens 8. When using an imprinting technique, a "master" mask is fabricated on glass, and the pattern on master mask is transferred to photoresist by imprinting. The imprinted photoresist is then etched by RIE to transfer the pattern from the imprinted photoresist to the InP layer 6.

Figure 10:
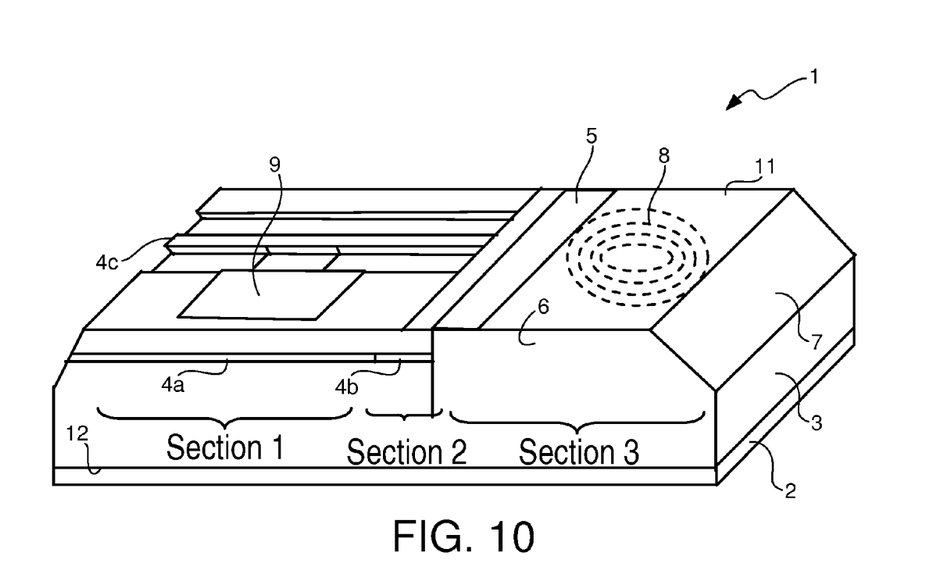
FIG. 10 shows a top perspective view of the device shown in FIG. 9 after the mask has been removed and n-type and p-type metal contacts have been formed on the device to complete the semiconductor laser device shown in FIG. 1.

FIG. 10 is a top perspective view that illustrates the final steps that are taken to form the completed semiconductor laser device 1 shown in FIG. 1. After the diffractive lens 8 has been formed, the mask 71 (FIG. 9) is removed and an HR coatings are applied to form the upper and side reflectors 5 and 7, respectively. Then, the p-type metal contact 9 is formed. The wafer is then thinned and metal evaporation is performed to form the n-type metal contact 2.

It should be noted that the above-described elements can be formed in any desired positions and orientations with respect to each other. It should also be noted that the invention has been described with reference to one or more illustrative embodiments for the purposes of demonstrating the principles and concepts of the invention and to provide one or more examples of the manner in which the invention may be implemented. For example, the laser 4 may have a ridge structure or buried structure, be straight or tilted, and have various electrical contact configurations. Also, the laser 4 may be any kind of semiconductor laser, including a Fabry-Perot (FP) laser, a DFB laser, or an electro-absorption modulator laser (EML). Furthermore, the laser 4 is not limited to being made on an InP substrate. Other substrates, such as GaAs substrates, for example, are also suitable for this purpose.

The invention has been described with reference to a few illustrative or exemplary embodiments for the purposes of describing the principles and concepts of the invention. The invention, however, is not limited to these embodiments, as will be understood by persons skilled in the art in view of the description provided herein. For example, while the substrate 3 and other layers of the device 1 have been described as using InP, the substrate 3 and the other layers may comprise any suitable material, such as GaAs, aluminum gallium (AlGa), aluminum gallium indium arsenide (AlGaInAs), etc. In addition, various other metal configurations may be used for the n-type and p-type metal contacts 2 and 9, respectively. Also, the laser operation may perform a single transverse mode or a multimode operation, or a longitudinally single mode operation. Also, the device 1 may include a combination of other integrated operational devices (e.g., modulators, amplifiers, waveguides, etc.). Those skilled in the art will understand that various modifications may be made to the embodiments described herein and that it is intended that the present invention cover all such modifications and variations.

What is claimed is:

1. A surface-emitting semiconductor laser device comprising:
    a semiconductor substrate having an upper surface and a lower surface;
    a plurality of semiconductor layers disposed on the upper surface of the semiconductor substrate, said plurality of semiconductor layers including an upper most layer, a lowermost layer and one or more layers in between the uppermost and lowermost layers;
    an edge-emitting laser formed in one or more of said plurality of semiconductor layers, the laser having an active multiple quantum well (MQW) region having a first end and a second end and a passive region having a first end and a second end, the second end of the active MQW region joining the first end of the passive region, the laser having a rear facet corresponding to the first end of the active MQW region and a front facet corresponding to the second end of the passive region, wherein if the laser is activated, laser light produced in the active MQW region propagates along an optical axis of the laser that is substantially parallel to the upper and lower surfaces of the substrate through the active MQW region, out of the second end of the active MQW region, into the first end of the passive region, through the passive region, and out of the front facet of the laser, the laser light diverging as it propagates out of the front facet;
    an upper reflector disposed on or near the uppermost layer of said plurality of semiconductor layers above the front facet of the laser;
    an angled side reflector disposed on an angled side facet formed in one or more of said plurality of semiconductor layers;
    a lower reflector disposed on or near the lower surface of the semiconductor substrate; and
    a diffractive lens disposed in at least the uppermost layer of said one or more semiconductor layers, and wherein the laser, the angled side reflector, the upper reflector, the lower reflector, and the diffractive lens are oriented in relation to one another such that a first portion of the laser light propagating out of the front facet impinges directly upon the upper reflector and is reflected thereby onto the angled side reflector and such that a second portion of the laser light propagating out of the front facet impinges directly upon the angled side reflector, wherein the angled side reflector reflects the impinging first and second portions of laser light onto the lower reflector, and wherein the lower reflector reflects the first and second portions of laser light through the diffractive lens, the diffractive lens directing the laser light in a direction that is substantially normal to the upper surface of the substrate.

2. The surface-emitting semiconductor laser device of claim 1, wherein the active MQW region and the passive region have first and second photoluminescence peaks, respectively, the second photoluminescence peak being lower than the first photoluminescence peak.

3. The surface-emitting semiconductor laser device of claim 2, wherein the passive region comprises MQW layers.

4. The surface-emitting semiconductor laser device of claim 2, wherein the passive region comprises a bulk quaternary layer.

5. The surface-emitting semiconductor laser device of claim 1, wherein the edge-emitting laser comprises a ridge structure.

6. The surface-emitting semiconductor laser device of claim 5, wherein the ridge structure extends parallel to the optical axis of the laser from at least the first end of the active MQW region past the second and first ends of the active and passive MQW regions, respectively.

7. The surface-emitting semiconductor laser device of claim 1, wherein the edge-emitting laser is a fabry-Perot (F-P) laser.

8. The surface-emitting semiconductor laser device of claim 1, wherein the edge-emitting laser comprises a buried diffractive grating formed in one or more of said plurality of semiconductor layers.

9. The surface-emitting semiconductor laser device of claim 1, wherein the edge-emitting laser is a distributed feedback (DFB) laser.

10. The surface-emitting semiconductor laser device of claim 1, wherein the edge-emitting laser is an electro-absorption modulator laser (EML).

11. The surface-emitting semiconductor laser device of claim 1, wherein the lower reflector is a metal contact layer disposed on the lower surface of the substrate.

* * * * *